United States Patent
Miura et al.

(10) Patent No.: US 6,737,660 B2
(45) Date of Patent: May 18, 2004

(54) ELECTRON BEAM IRRADIATION APPARATUS AND ELECTRON BEAM IRRADIATING METHOD

(75) Inventors: Yoshihisa Miura, Kanagawa (JP); Yuichi Aki, Tokyo (JP); Hiroshi Kawase, Kanagawa (JP); Masanobu Yamamoto, Kanagawa (JP); Naoki Date, Tokyo (JP); Setsuo Norioka, Tokyo (JP); Mitsuru Koizumi, Tokyo (JP); Gakuo Komatsubara, Tokyo (JP)

(73) Assignees: Sony Corporation, Tokyo (JP); Jeol Ltd., Tokyo (JP)

( * ) Notice: Subject to any disclaimer, the term of this patent is extended or adjusted under 35 U.S.C. 154(b) by 0 days.

(21) Appl. No.: 10/372,419

(22) Filed: Feb. 24, 2003

(65) Prior Publication Data

US 2003/0178581 A1 Sep. 25, 2003

(30) Foreign Application Priority Data

Feb. 26, 2002 (JP) ....................... 2002-050146

(51) Int. Cl.[7] .............. G11B 9/10; H01J 37/18; H01J 33/02
(52) U.S. Cl. ................ 250/492.3; 250/441.11; 369/101; 219/121.22; 219/121.24
(58) Field of Search ............ 250/492.2, 492.3, 250/441.11; 369/101; 219/121.22, 121.24

(56) References Cited

U.S. PATENT DOCUMENTS 4,607,167 A * 8/1986 Petric ....................... 250/492.2
6,300,630 B1 * 10/2001 Veneklasen ................. 250/310
6,649,859 B2 * 11/2003 Miura et al. ........... 219/121.22
2001/0052577 A1 * 12/2001 Aki et al. ................ 250/492.2

* cited by examiner

Primary Examiner—Jack Berman
(74) Attorney, Agent, or Firm—Frommer Lawrence & Haug LLP; William S. Frommer

(57) ABSTRACT

An electron beam irradiation apparatus in a partial vacuum method is structured with a static pressure floating pad 18 connected to a vacuum chamber 14 containing an electron beam column 15 and in a condition that the static pressure floating pad 18 is attached to a subject 1 to be irradiated without contacting, and an electron beam irradiating the subject 1 to be irradiated through an electron beam path 19 of the static pressure floating pad 18, whereby the vacuum chamber and the electron beam column can be maintained in the required degree of vacuum even in a condition that the static pressure floating pad 18 is separated from the subject 1 to be irradiated. A vacuum seal valve 30 including a piston to open and close the electron beam path 19 is provided within the static pressure floating pad 18. When the static pressure floating pad 18 is separated from the subject 1, the vacuum seal valve 30 is structured to be activated to close the electron beam path 19 so as to prevent the air from flowing into the vacuum chamber 14. In this structure, the vacuum seal valve 30 is formed with a round shaped cross section and in a tapered shape with a narrow tip so as to accomplish high vacuum seal without a gap, so that the degree of vacuum in the vacuum chamber and the electron beam column can surely be maintained.

11 Claims, 9 Drawing Sheets

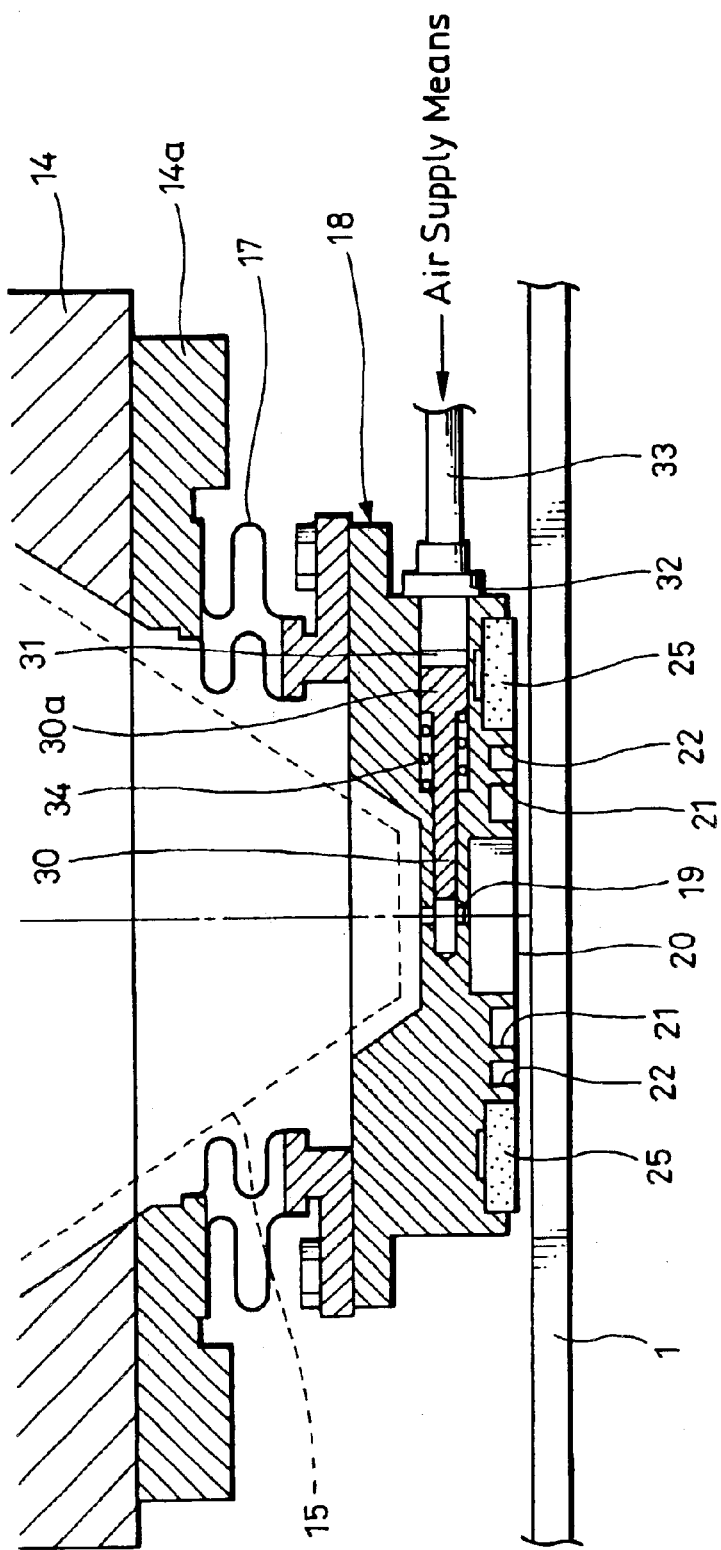

ELECTRON BEAM IRRADIATION APPARATUS AND ELECTRON BEAM IRRADIATING METHOD

BACKGROUND OF THE INVENTION

1. Field of the Invention

The present invention relates to an electron beam irradiation apparatus and an electron beam irradiating method, for example used in master recording for an optical disk.

2. Description of the Related Art

In recent years, a much higher density has been demanded for optical disks, so that a finer formation of recording pits is needed to accomplish thereof. On this account, in the production of a master disk of an optical disk, there has been proposed an apparatus for irradiating a master disk with an electron beam instead of conventional laser beams for recording.

In this electron beam irradiation apparatus, an electron beam irradiation in a vacuum environment is needed to prevent the electron beam from colliding against gas molecules to be scattered. In this case, when the entire electron beam irradiation apparatus is placed in the vacuum environment, a large vacuum space and a large exhaust means will be needed, resulting in a large and expensive apparatus.

To avoid this, the applicant previously proposed an electron beam irradiation apparatus in a partial vacuum method where only a portion irradiated with the electron beam is placed in a vacuum condition, in a Japanese Patent Application No.2000-57374.

Specifically, this electron bean irradiation apparatus is structured in such a way that a static pressure floating pad is connected to an outlet of the electron beam of a vacuum chamber containing an electron bean column, the static pressure floating pad is attached without contacting and with a little gap of the order of several micro meters ($\mu$m) to the master disk by a suction through an exhaust means and a supply of compressed gas through an air supply means, and in this condition, the electron beam emitted from an electron gun passes through an electron beam path in the center of the static pressure floating pad to be irradiated on the master disk.

In the electron beam irradiation apparatus structured in this way, when a replacement operation of the master disk is executed, the static pressure floating pad needs to be released from the master disk. In this case, the static pressure floating pad is completely separated from the master disk, so that the air flows through the electron beam path of the static pressure floating pad into the vacuum chamber and the electron beam column is exposed to open air.

Accordingly, the workability is extremely bad in such a way that a gate valve of the electron beam column needs to be closed to protect the electron gun while maintaining the previous high vacuum prior to releasing the static pressure floating pad, and the power needs to be turned off in order to protect the exhaust means (vacuum pump) for vacuumizing the vacuum chamber.

Additionally, when a vacuum system is restarted after the master disk is replaced, several hours are to be spent until that the degree of vacuum in the vacuum chamber is increased to the extent that the irradiation of the electron beam is not disturbed, and the degree of vacuum is stabilized. Therefore, this is an extremely inefficient system in such a manner that waiting time is longer than the time for recording the master disk by the electron beam irradiation.

In another aspect, because the vacuum chamber falls under the open-air condition every time when the master disk is replaced, there has been a problem of contamination in the vacuum chamber and the electron beam column due to the result of sucking dust in the air.

SUMMARY OF THE INVENTION

In light of these problems, it is an object of the present invention to solve the above-mentioned problems in a manner that the necessary vacuum can be maintained in the vacuum chamber even in the condition where the static pressure floating pad is separated from the subject to be irradiated (master disk) in the electron beam irradiation apparatus in a partial vacuum method.

To solve the aforementioned problems, the present invention is characterized in that an electron beam irradiation apparatus is structured with a static pressure floating pad connected to a vacuum chamber containing an electron beam column and in a condition that the static pressure floating pad is attached to a subject to be irradiated without contacting, an electron beam is irradiated on the subject to be irradiated through an electron beam path of the static pressure floating pad, wherein a vacuum seal valve is provided with a piston to open and close the electron beam path inside of the static pressure floating pad and the vacuum seal valve is formed with a cross section in a round shape. Additionally, in this structure, the vacuum seal valve is preferably formed with a cross section in a round shape, and in a tapered shape with a narrow tip and a wide root. The vacuum seal valve may also be structured such that the cross section is in the round shape, an elastic material is attached to the tip thereof, and the elastic material is radially expanded by a pushing force of the valve to block the electron beam path.

In the electron beam irradiation apparatus of the present invention structured in this way, when the static pressure floating pad is released from the subject to be irradiated, the vacuum valve is activated to close the electron beam path so as to accomplish vacuum-sealing, whereby the vacuum chamber and the electron beam column can be maintained in the desired degree of vacuum. Specifically, in the present invention, the vacuum seal valve is formed with the cross section in the round shape to facilitate high-precision machining. Moreover, the vacuum seal valve is formed in the tapered shape with the narrow tip, so that a high vacuum seal with almost no gap can be accomplished. Additionally, in the structure that the elastic material on the tip is radially expanded by the pushing force of the valve to block the electron beam path, the degree of vacuum in the vacuum chamber and the electron beam column can reliably be maintained.

BRIEF DESCRIPTION OF THE DRAWINGS

FIG. 3 is a longitudinal sectional-view of the static pressure floating pad according to the present invention.

DESCRIPTION OF THE PREFERRED EMBODIMENTS

Figure 1:
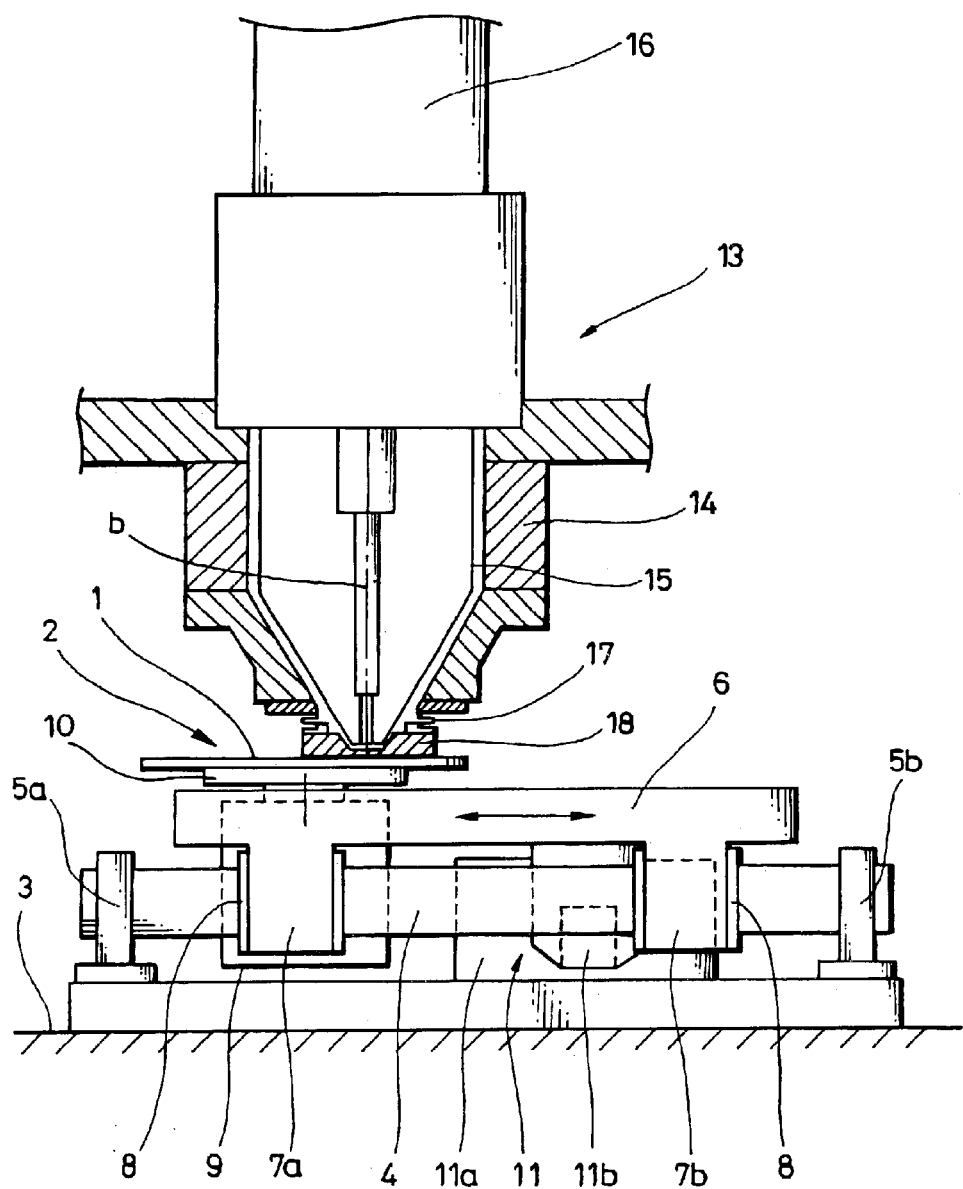
FIG. 1 is a front view showing the basic structure of the electron irradiation apparatus in the partial vacuum method according to the present invention.
Figure 2:
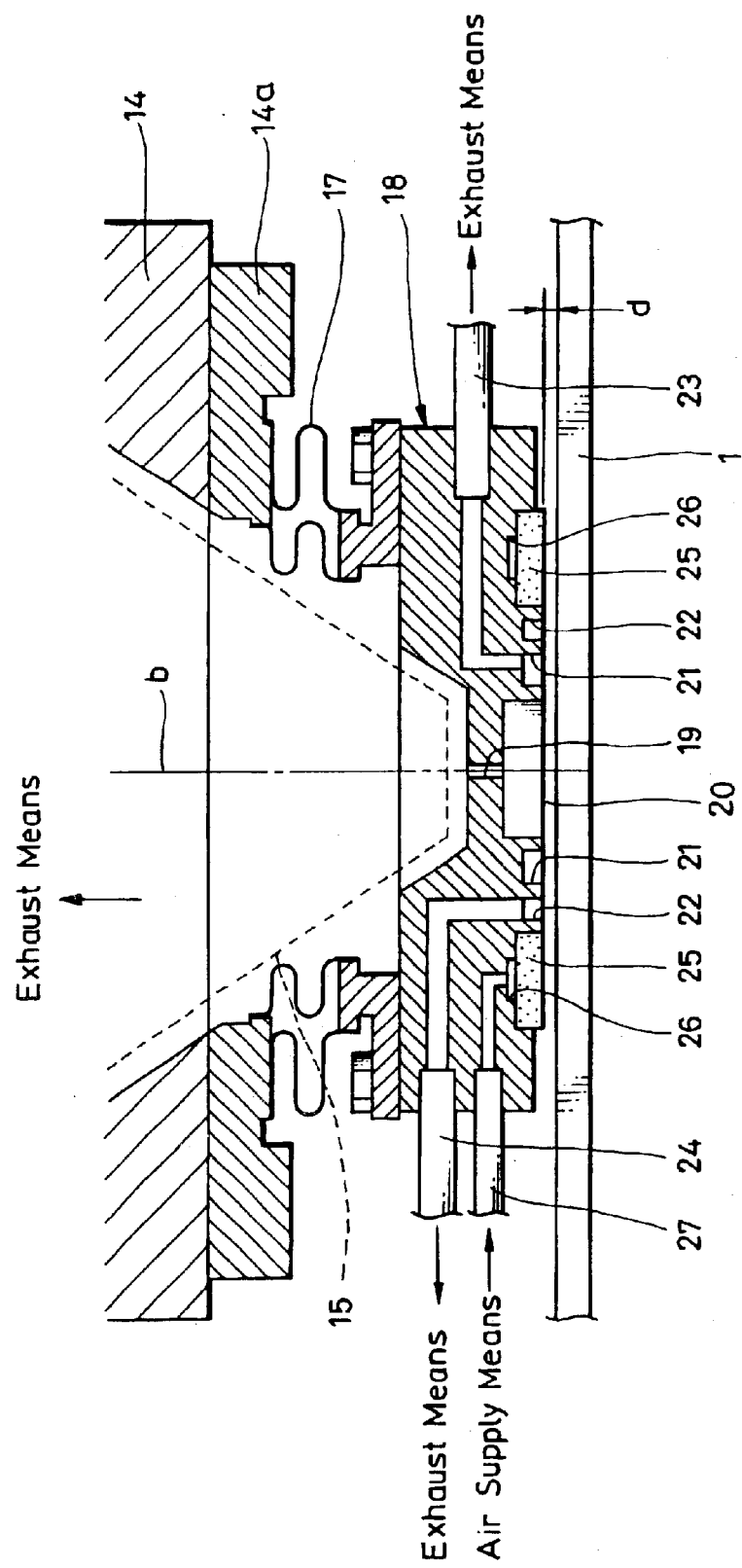
FIG. 2 is a longitudinal sectional-view showing the static pressure floating pad provided in the electron beam irradiation apparatus.

Referring to the drawings, an embodiment of the present invention is described in detail hereinafter. An electron beam irradiation apparatus used in master recording of an optical disk is exemplified here. Referring first to FIGS. 1 and 2, a basic structure of the electron beam irradiation apparatus is described.

As shown in FIG. 1, this apparatus records a signal (a formation of recording pits for a signal pattern) by irradiating a master disk 1 to be irradiated with an electron beam b emitted from an electron gun 16. While the irradiation of the electron beam requires a vacuum environment, specifically this apparatus employs a partial vacuum method that only one portion, where the electron beam is irradiated, is to be in a vacuum condition and the other portions is placed in the air.

First, a supporting mechanism section 2 supporting a master disk 1 in this apparatus is described. A guide rail 4 is horizontally positioned on a base 3 of the apparatus and the both of the right and left ends thereof are fixed with holding parts 5a and 5b. On the guide rail 4, a slide table 6 is movably supported by bearings 8 provided on legs 7a and 7b on the both sides. For the bearings 8, the use of a hydrostatic air bearing can implement a highly accurate movable mechanism with an extremely little frictional resistance while the slide table 6 is moving.

Additionally, a motor 9 as a rotating means for the master disk 1 is fixed to the slide table 6, so that the master disk 1 is horizontally mounted and supported on a rotating table 10 attached to a rotary axis of the motor 9.

The motor 9 for rotating the master disk uses an electromagnetically driven spindle motor. The motor 9 is driven according to a control signal from a control circuit, and thereby rotating the master disk 1 integrated with the rotating table 10. The motor 9 uses the hydrostatic air bearing for a bearing of the rotary axis, so that a load caused by the frictional resistance during the rotation can be decreased to accomplish a high-precision rotation mechanism with a good response.

Additionally, in the apparatus, as a chucking method for securely holding the master disk 1 on the rotating table 10, a vacuum adsorption method is employed.

Moreover, a motor 11 as a moving means is arranged between the slide table 6 and the base 3. An electromagnetically driven linear motor is used in the motor 11 for moving the slide table. Specifically, for example a voice coil magnetic circuit is arranged between a stationary part ha on the side of the base 3 and a movable part 11b on the side of the slide table 6. This linear motor is structured in such a way that the motor 11 is driven according to the control signal from the control circuit, so that the slide table 6 is horizontally moved along the guide rail 4, resulting in radially moving the master disk 1 integrated therewith.

An electron beam irradiating means 13, which irradiates the electron beam by having a partial vacuum condition over the master disk 1, is fixedly arranged in relation to and over the supporting mechanism section 2 of the master disk structured in this way. Reference number 14 indicates a vacuum chamber suspended and supported above the master disk 1. An electron beam column 15 is arranged within the vacuum chamber and the electron beam b is emitted from the electron gun 16 as an exciting source of the electron beam upstream of the electron beam column 15.

An exhaust means including a vacuum pump is coupled to the vacuum chamber 14 containing the electron beam column 15. The exhaust means is adapted to suck air inside of the vacuum chamber 14 to maintain the degree of vacuum (the order of $1 \times 10^{-4}$<Pa>) in such an extent that there is no obstruction to irradiate the electron beam in the electron beam column 15.

A static pressure floating pad 18 is attached to an outlet of the electron beam on the lower end of the vacuum chamber 14 through an expansion coupling mechanism 17. The static pressure floating pad 18 is attached without contacting and with a little gap of the order of 5 $\mu$m to the master disk 1. In such a condition, the electron beam b emitted from the electron gun 16 passes through an electron beam path in the center of the static pressure floating pad 18 to be irradiated on the master disk 1.

FIG. 2 illustrates the detailed structure of the static pressure floating pad 18. The static pressure floating pad 18 is constituted by for example a metal block 20 having an electron beam path 19 in which the electron beam b passes through the center thereof. The block 20 is air tightly coupled to a fixed portion 14a on the lower end of the vacuum chamber 14 by a bellows-like expansion coupling mechanism 17. Even when the master disk 1 has an uneven thickness and rotational wobbling, the expansion of the expansion coupling mechanism 17 allows the block 20 to surely be attached onto the master disk 1 by tracking such irregularity.

Additionally, as means for attaching the block 20 onto the master disk 1, in the block 20, a first suction channel 21 and a second suction channel 22 opening on opposed faces to the master disk 1 are formed in a concentric manner that the electron beam path 19 is centered.

The exhaust means is connected to the first suction channel 21 and the second suction channel 22 through exhaust tubes 23 and 24, respectively. The exhaust means is designed to discharge or suck gas from the first suction channel 21 and the second suction channel 22.

As these exhaust means, vacuum pumps are used. In this case, the suction channel closer to the electron beam path 19 is connected to the vacuum pump which can emit gas to have the higher vacuum. Specifically, the first suction channel 21 near the electron beam path 19 is connected to the vacuum pump which can obtain the degree of vacuum of the order of $1 \times 10^{-1}$<Pa>, and the second suction channel 22 outer than this is connected to the vacuum pump which can obtain the degree of vacuum of the order of $5 \times 10^{3}$<Pa>.

Furthermore, ventilating elements 25 exposed on the opposed face, on the outer side of the second suction channel 22 in relation to the master disk 1 are embedded in the block 20. The ventilating elements 25 are formed in a ring shape, in which the electron beam path is centered, using a porous metal having breathability or ceramics including carbon as a material. On the backside of the ventilating elements 25, gas passages 26 are formed inside of the block 20.

An air supply means is connected to the gas passage 26 through air supply tube 27. The air supply means provides for example compressed gas with the order of $5 \times 10^5 <Pa>$ (positive pressure) into the gas passage to jet the gas from the ventilating element 25.

When respective exhaust means and air supply means are activated in such a condition that the static pressure floating pad 18 constructed as just described is placed on the master disk 1, the static pressure floating pad 18 is floated slightly from the master disk 1 by the gas emitted from the ventilating element 25. The gas is sucked from the first and second suction channels 21 and 22 at the same time, so that the inside of the channels becomes in negative pressure to force the static pressure floating pad 18 to stick to the master disk 1. Consequently, there will be a condition where the static pressure floating pad 18 is attached without contacting, while keeping a gap d with the order of 5 μm to the master disk 1, resulting in leaving no harm to the rotation of the master disk 1.

At this point, the gas emitted from the ventilating element 25 is sucked through the first and second suction channels 21 and 22 formed in the periphery thereof so as to avoid going into the electron beam path 19. In this case, the gas from the ventilating element 25 is first sucked by the second suction channel 22 and then by the first suction channel 2. The suction of the first suction channel 21 is stronger than that of the suction channel 22, so that the degree of vacuum can be increased with approaching closer to the center of the static pressure floating pad 18. Therefore, the inside of the vacuum chamber 14 or the inside of the electron beam column 15 can be maintained in the degree of vacuum (the order of $1 \times 10^{-4} <Pa>$ that the irradiation of the electron beam is not interfered.

Then, the electron beam b is irradiated onto the master disk 1 in a condition that a part over the master disk 1 is partially under vacuum by the static pressure floating pad 18. At the same time, the motor 9 of the supporting mechanism section 2 is driven to rotate the master disk 1 and the motor 11 is driven to radially move the master disk 1, and thereby recording on a predetermined track.

The electron beam irradiation apparatus constructed as described above employs the partial vacuum method that only a portion, where the electron beam is irradiated, is under vacuum. As a result, vacuum retention for a large space is not needed so as to avoid using a large exhaust means (vacuum pump), and hence the apparatus can be constructed compactly and inexpensively.

However, in the electron beam irradiation apparatus in the partial vacuum method, when the replacement operation of the master disk 1 is performed, the emission (suction) from the first and second suction channels 21 and 22 of the static pressure floating pad 18 is stopped, and thereby moving the static pressure floating pad 18 radially or upwardly from the master disk 1 to be on standby.

At this point, in order to prevent the air flowing into the vacuum chamber 14 from the electron beam path 19 of the static pressure floating pad 18 by moving the static pressure floating pad 18 away from the master disk 1, specifically the electron beam irradiating apparatus according to the present invention is structured with a vacuum seal valve mechanism within the static pressure floating pad 18.

FIG. 3 shows the vacuum seal valve mechanism in detail. In the present embodiment, the vacuum seal valve including a piston 30 is perpendicular to the electron beam path 19, and laterally and slidably built within the block 20 constituting the static pressure floating pad 18.

The piston 30 constituting the vacuum seal valve includes a rod element with a cross section in a round shape as described later, and is structured to open and close the electron beam path by moving the piston 30.

As an actuating means for the piston 30, an air cylinder section 31 is provided in the block 20 and a base 30a of the piston 30 is slidably fitted in the air cylinder section 31 with no gap therebetween. The air supply means including an air pump is connected to the outside of the air cylinder section 31 through an air joint 32 and an air supply tube 33. The compressed gas is supplied from the air supply means to the air cylinder section 31 so as to push the piston 30 thereto. Additionally, the air cylinder section 31 contains compressed coil springs 34 on the inner side, so that the elasticity of the springs 34 gives a returning force to the piston 30.

Figure 4A:
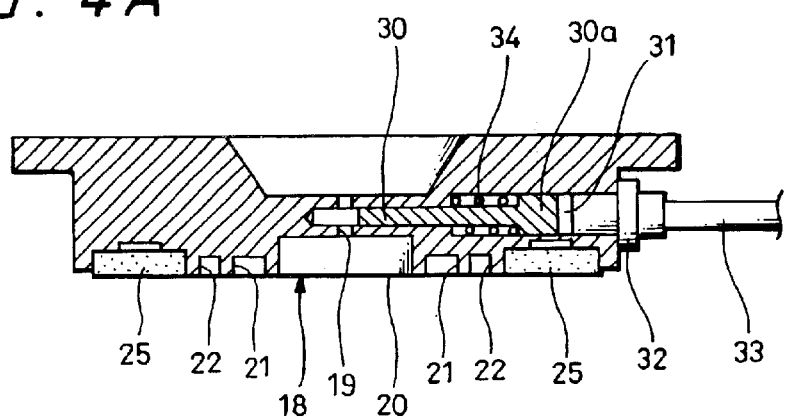
FIG. 4 is an operational explanatory diagram of the vacuum seal valve mechanism in the static pressure floating pad where FIG. 4A indicates the valve in the opened state and FIG. 4B indicates the valve in the closed state.

Under a normal condition or a condition that the compressed gas is not supplied, the piston 30 is located in the retracted position away from the electron beam path 19 by the returning force of the springs 34. As a result, the electron beam path 19 is in the opened state. Under this condition, the electron beam is irradiated (See FIG. 4A).

Figure 4B:
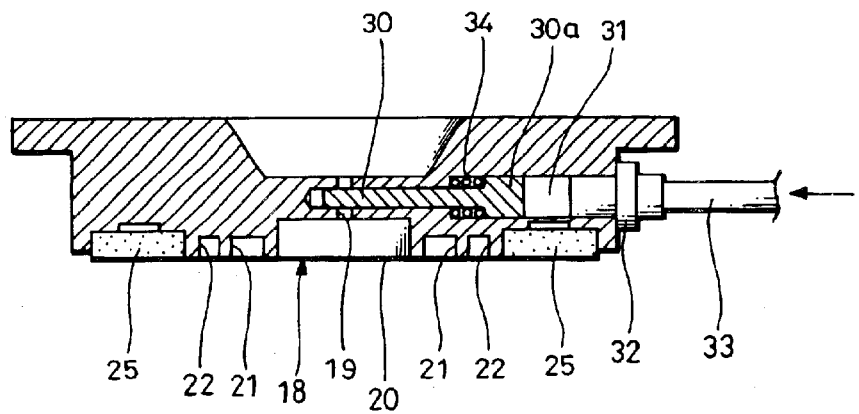

In addition, when the static pressure floating pad 18 is retracted, the compressed gas is supplied from the air supply means, so that the piston 30 is pushed to move forward against the returning force of the springs 34, resulting in the electron beam path 19 been blocked (See FIG. 4B). This causes the electron beam path 19 to be closed to be vacuum-sealed. Specifically, under this condition, the air will not flow from the electron beam path 19 into the vacuum chamber 14.

In this way, the vacuum seal valve mechanism of the present embodiment is constructed in a simple manner that the returning force of the springs and the pushing force of the compressed gas are used to open and close the electron beam path 19. Consequently, in this structure, springs need to be selected in order that the pushing force of the compressed gas will be stronger than the force of the springs. On the other hand, the pushing force will be the product of multiplying the cross-sectional area of the base 30a of the piston 30 by the pressure of the compressed gas. The larger this value is, the stronger the pushing force of the piston becomes, resulting in increasing the stability while the valve is opened and closed.

Additionally, to prevent burning-in or melting-in while slidably moving, the piston 30 is desirably manufactured with a metal material different from that of block 20 of the static pressure floating pad 18. For instance, as a material of the block 20 of the static pressure floating pad 18, aluminum is suitably used, and in this case, brass may be used to manufacture or make the piston 30.

In another aspect, the piston 30 is formed with a surface layer which has a little friction resistance while sliding and is hard on the surface thereof, so that operational stability may further be improved. In addition, the surface layer thereof desirably has electrical conductivity to prevent electrification by the electron beam. Electroless nickel plating is suitable on the surface layer. In addition to this, surface treatment is applied thereto by Teflon impregnation, so that a very smooth and hard surface layer can be formed.

Figure 5:
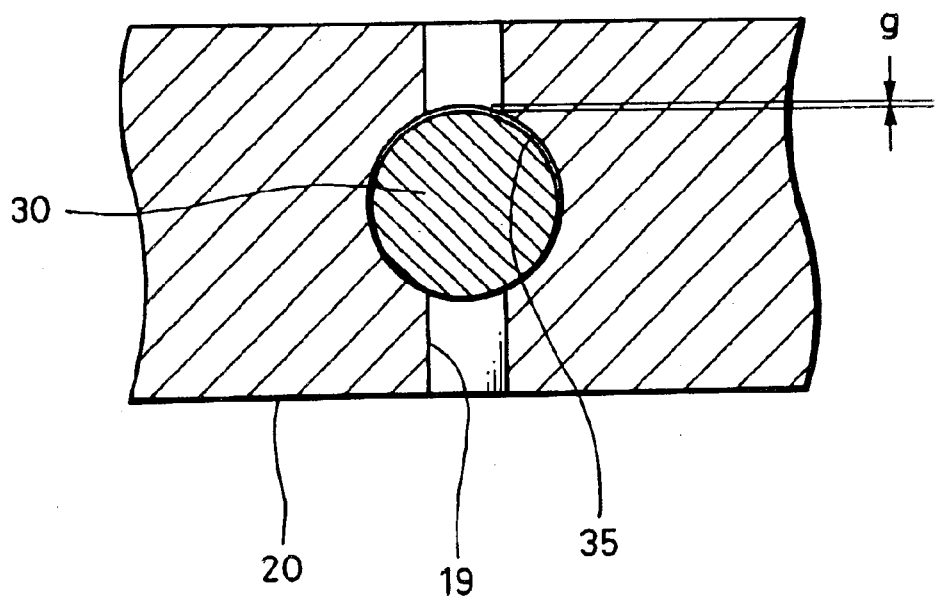
FIG. 5 is a view showing the cross sectional shape of the vacuum seal valve.

Subsequently, the shape of the piston 30 is further described in detail. First, as shown in FIG. 5, the piston 30 is characterized by the shape that the cross section thereof is formed in a generally perfect-circle like round shape. The biggest advantage to form the piston 30 with the cross section in the round shape includes a respect that working accuracy can be easily improved.

To achieve a stable open/close operation of the valve or a sliding movement of the piston 30, a certain degree of a gap g is needed between the piston 30 and a hole 35 of the block 20 where the piston 30 is inserted. However, when the gap is big, the air flows into the vacuum chamber 14 therefrom. As a result, the degree of vacuum cannot be maintained in the chamber.

Therefore, the piston 30 is formed with the cross section in the round shape, the piston 30 is turned and the side of the hole 35 is machined by a machining center or the like using a reamer, whereby the surface roughness of the seal face can easily be reduced less than 0.8 s at the maximum height and the gap g can be reduced less than 10 $\mu$m.

Figure 6:
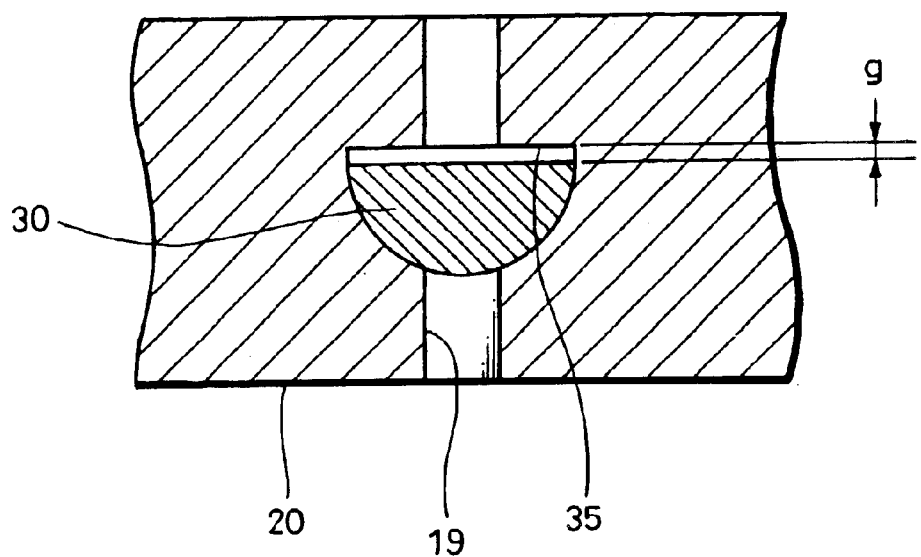
FIG. 6 is a reference view of the cross sectional shape of the vacuum seal valve.

Now for reference purposes, the embodiment of the piston 30 with a cross section not in a round shape is shown in FIG. 6. This indicates a vacuum seal valve previously proposed in Japanese Patent Application No.2001-54739 by the applicant and the piston 30 has a cross section formed in a semicircular shape. In this case, in the limit of end milling by a milling machine, the surface roughness of the seal face is of the order of 6.3 s at the maximum height and the gap g is at least several tens of $\mu$m. Accordingly, the air tends to flow from the gap, so that it is difficult to stably maintain the degree of vacuum in the vacuum chamber 14.

On the contrary, in the present embodiment, the piston 30 is designed with the cross section formed in the round shape as previously described, so that the surface roughness can be reduced to less than 0.8 s and the gap g can be reduced to less than 10 $\mu$m, resulting in significantly decreasing the air flowed from the gap. As a result, high vacuum sealing can be achieved within the vacuum chamber 14 and the electron beam column 15, and as an apparatus, less than the minimum required $1 \times 10^0$<Pa> (in vacuum that a high vacuum turbo molecular pump as an exhaust means is steadily operational) can be maintained in the vacuum chamber 14 and the electron beam column 15.

In the case of general machine tools, there is a problem of shakes of tools and works (runouts), so that it is difficult to maintain the gap between the piston 30 and the hole 35 constant in a feeding direction of the machine. In most cases, despite the small amount of runouts, a tapered shape in which a tip is narrow and a root is thick will be formed. If so, this may adversely affect on the vacuum seal.

Figure 7:
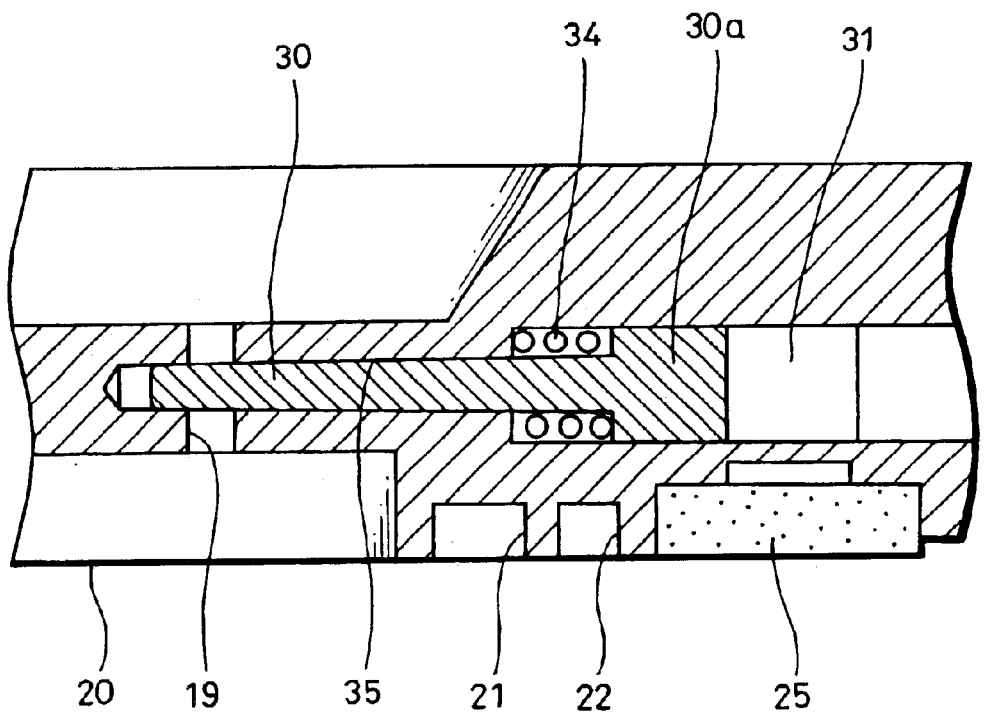
FIG. 7 is an enlarged view of a main portion of the vacuum seal valve mechanism in the static pressure floating pad.

Therefore, as shown in FIG. 7, in anticipation of such an adverse effect, it is effective to have a structure that the piston 30 and the hole 35 are initially formed in the shape that the tip is narrow and the root is thick (e.g. taper of the order of 1/500) so as to prevent the effect as much as possible. In this case, when the piston 30 is pushed to close the electron beam path 19, the piston 30 is tightly engaged in the hole 35 like a wedge. Consequently, the further improvement of vacuum seal characteristics can be expected.

Figure 8A:
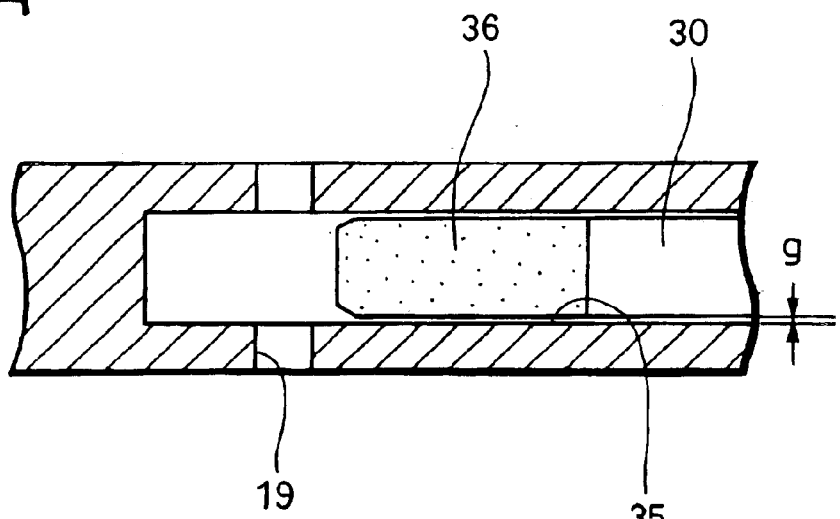
FIG. 8 is a view showing another structural example of the vacuum seal valve where FIG. 8A indicates the valve in the opened state and FIG. 8B indicates the valve in the closed state.
Figure 8B:
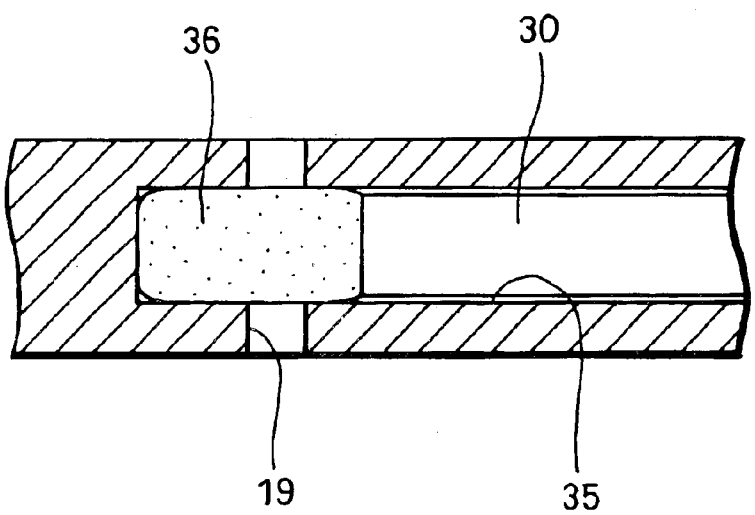

FIGS. 8A and 8B show another constructional embodiment of the vacuum seal valve. This does not have a structure in which the gap between the piston 30 and the hole 35 are minimized to improve the vacuum seal characteristics. As shown, the valve has a structure with a combination of the piston, in which an elastic material 36 is attached to the tip of the piston 30 and the elastic material 36 is radially expanded by the pushing force of the valve to eliminate the gap and improve the vacuum seal characteristics.

The piston 30 is formed with the cross section in a generally round shape including the elastic material 36 on the tip, so that the combination of the piston 30 and the elastic material 36 can easily be implemented.

Figure 9:
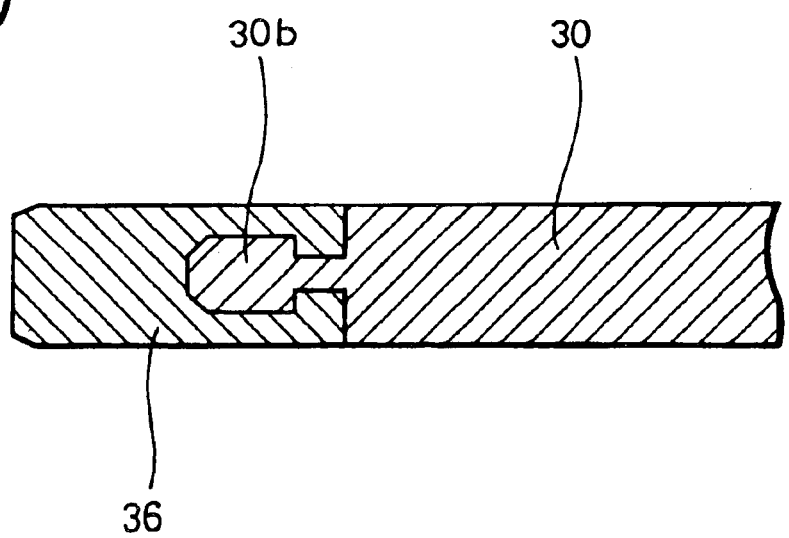
FIG. 9 is a view showing one example of the combined structure of the vacuum seal valve shown in FIG. 8.

One example of the combined structure of the piston 30 and the elastic material 36 is shown in FIG. 9. Specifically, the elastic material 36 is engaged with a protruded stationary core 30b on the piston 30 to be integrally arranged in this structure. In this case, the tip of the stationary core 30b is thickly formed, so that the elastic material 36 is designed to be securely fixed without escaping from the piston 30. The piston 30 is formed with the cross section in the generally rounded shape including the elastic material 36, so that the combination can easily be implemented without the need of troublesome positioning in installing the elastic material 36.

Additionally, in the condition that the piston 30 is pushed in by the compressed gas, as shown in FIG. 8B, the elastic material 36 on the tip is hit against the deepest side of the hole 35, whereby the elastic material 36 is shrunk in a direction of pushing in and correspondingly, the elastic material 36 is radially inflated to undergo an elastic deformation, resulting in blocking the electron beam path 19 without a gap.

In this structure, the gap g between the piston 30 and the hole 35 does not need to be controlled with so much high precision, and hence costs such as a machining cost and the like can be significantly reduced in comparison with the prior embodiment. In addition, the elastic deformation of the elastic material 36 is greater than this gap so that the gap can basically be left zero and the vacuum seal characteristics will further be improved. As a result, the vacuum chamber 14 may be maintained in the degree of vacuum (the order of $10^{-1}$ to $10^{-2}$<Pa>) higher than that of the previous embodiment.

Moreover, in this structure, the material of the elastic material 36 is desirably a conductive rubber in order to eliminate the electrically charged effects by the electron beam. As the conductive rubber for example a silicone rubber may suitably be used.

In the electron beam irradiation apparatus having the static pressure floating pad 18 with the vacuum seal valve mechanism described above, the vacuum chamber 14 and the electron beam column 15 can always be maintained in a high vacuum condition. Therefore, there is no need to close a gate valve of the electron beam column to protect the electron gun and turn off the power of the exhaust means of the vacuum chamber 14 every time when the static pressure floating pad is detached from the master disk. Consequently, a waiting time required for stabilizing the vacuum emission and the electron beam can be significantly shortened from several hours to several minutes. Additionally, the vacuum chamber can always be maintained in a vacuum condition, so that contamination in the vacuum chamber and the electron beam column can effectively be prevented.

While examples applied to the electron beam irradiation apparatus used for master recording for the optical disk as embodiments of the present invention have been shown, it is to be understood that the invention is not limited thereto and can be used in a wide variety of applications including for example electron beam irradiation to quartz and silicon wafers used in a liquid crystal and a semiconductor structures, and various kinds of checking and microscopic devices by the electron beam irradiation.

As just described, in the present invention, the electron beam irradiation apparatus in a partial vacuum method using the static pressure floating pad can be sealed in high vacuum by the vacuum seal valve even in the condition that the static pressure floating pad is separated from a subject to be irradiated, and hence the vacuum chamber and the electron beam column can surely be maintained with the required degree of vacuum.

As a result, the electron beam irradiation apparatus of the present invention does not require closing the gate valve of the electron beam column to protect the electron gun and turn off the power of the exhaust means of the vacuum chamber, every time when the static pressure floating pad is detached from the subject to be irradiated. Consequently, a waiting time required for stabilizing the vacuum emission and the electron beam can be significantly shortened and the improvement of the workability can be achieved by simplifying an operation and shortening a operation hours.

In addition, the vacuum chamber can always be maintained in a vacuum condition and thereby preventing contamination in the vacuum chamber and the electron beam column as well as posing an effect on extending an electron gun life.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. An electron beam irradiation apparatus having a structure in which a static pressure floating pad is connected to a vacuum chamber containing an electron beam column and an electron beam is irradiated to a subject to be irradiated passing through an electron beam path of said static pressure floating pad in a condition that said static pressure floating pad is attached to the subject to be irradiated without contacting, wherein a vacuum seal valve including a piston to open and close said electron beam path is provided within said static pressure floating pad, and said vacuum seal valve is formed with a cross section in a round shape.

2. An electron beam irradiation apparatus according to claim 1, wherein said vacuum seal valve has the cross section in the round shape and is formed in a tapered shape with a narrow tip and a thick root.

3. An electron beam irradiation apparatus according to claim 1, wherein said vacuum seal valve is manufactured with a metal material different from that of said static pressure floating pad.

4. An electron beam irradiation apparatus according to claim 1, wherein said vacuum seal valve is formed with a surface layer having a low friction resistance and being hard.

5. An electron beam irradiation apparatus according to claim 1, wherein said vacuum seal valve is formed with a surface layer having a low friction resistance and being hard, and said surface layer has electrical conductivity.

6. An electron beam irradiation apparatus according to claim 1, wherein said vacuum seal valve is structured with the cross section in the round shape and an elastic material attached on a tip thereof, and said elastic material is radially expanded by a pushing force of said valve so as to block said electron beam path.

7. An electron beam irradiation apparatus according to claim 6, wherein said vacuum seal valve is structured with the cross section in the round shape and said elastic material attached to the tip and said elastic material is radially expanded by the pushing force of said valve so as to block said electron beam path, and said elastic material has electrical conductivity.

8. An electron beam irradiation apparatus according to claim 1, wherein said vacuum seal valve has a structure for operating to close said electron beam path by a pushing force caused by a compressed gas and open said electron beam path by a returning force caused by a spring.

9. In an electron beam irradiation apparatus having a structure in which a static pressure floating pad is connected to a vacuum chamber containing an electron beam column and an electron beam is irradiated to a subject to be irradiated passing through an electron beam path of said static pressure floating pad in a condition that said static pressure floating pad is attached to the subject to be irradiated without contacting, a method for irradiating an electron beam, wherein a vacuum seal valve includes a piston formed with a cross section in a round shape incorporated into said static pressure floating pad, and said electron beam path is blocked by said vacuum seal valve.

10. A method for irradiating an electron beam according to claim 9, wherein said vacuum seal valve includes a piston having a cross section in a round shape and formed in a tapered shape with a narrow tip and a thick root.

11. A method for irradiating an electron beam according to claim 9, wherein said vacuum seal valve includes a piston having a cross section in a round shape and an elastic material attached to the tip, and said elastic material is radially expanded by a pushing force of said valve so as to block said electron beam path.

* * * * *